(12) United States Patent
Okabe et al.

(10) Patent No.: US 8,186,927 B2
(45) Date of Patent: May 29, 2012

(54) CONTAINED OBJECT TRANSFER SYSTEM

(75) Inventors: Tsutomu Okabe, Tokyo (JP); Toshihiko Miyajima, Tokyo (JP); Hiroshi Igarashi, Tokyo (JP)

(73) Assignee: TDK Corporation, Tokyo (JP)

( * ) Notice: Subject to any disclaimer, the term of this patent is extended or adjusted under 35 U.S.C. 154(b) by 420 days.

(21) Appl. No.: 12/471,987

(22) Filed: May 26, 2009

(65) Prior Publication Data

US 2009/0297298 A1  Dec. 3, 2009

(30) Foreign Application Priority Data

May 27, 2008 (JP) .................................. 2008-137946

(51) Int. Cl.
*B65G 49/07* (2006.01)
(52) U.S. Cl. .................................... 414/217.1; 414/411
(58) Field of Classification Search ............... 414/217.1, 414/411
See application file for complete search history.

(56) References Cited

U.S. PATENT DOCUMENTS

| | | | | |
|---|---|---|---|---|
| 5,562,383 A | * | 10/1996 | Iwai et al. .................. | 414/217.1 |
| 5,613,821 A | * | 3/1997 | Muka et al. ................. | 414/217.1 |
| 5,752,796 A | * | 5/1998 | Muka ......................... | 414/217.1 |
| 5,876,280 A | * | 3/1999 | Kitano et al. ................ | 454/187 |
| 5,970,621 A | * | 10/1999 | Bazydola et al. ............. | 33/613 |
| 6,068,668 A | * | 5/2000 | Mastroianni ................. | 29/25.01 |
| 6,158,946 A | * | 12/2000 | Miyashita ..................... | 414/411 |
| 6,331,890 B1 | * | 12/2001 | Marumo et al. .............. | 356/369 |
| 6,701,972 B2 | * | 3/2004 | Dickinson et al. ............ | 141/8 |
| 6,817,822 B2 | * | 11/2004 | Tokunaga ..................... | 414/217 |
| 6,869,263 B2 | * | 3/2005 | Gilchrist ....................... | 414/217 |
| 6,996,453 B2 | * | 2/2006 | Ahn et al. ..................... | 700/213 |
| 7,021,882 B2 | * | 4/2006 | Otaguro ..................... | 414/217.1 |
| 7,789,609 B2 | * | 9/2010 | Okabe et al. ................. | 414/217 |
| 2008/0025824 A1 | * | 1/2008 | Hashimoto ............... | 414/217.1 |
| 2009/0035099 A1 | | 2/2009 | Okabe et al. | |
| 2009/0175709 A1 | | 7/2009 | Okabe et al. | |

FOREIGN PATENT DOCUMENTS

| | | |
|---|---|---|
| JP | 2003-45933 | 2/2003 |
| JP | 2006-19726 | 1/2006 |

* cited by examiner

*Primary Examiner* — James Keenan
(74) *Attorney, Agent, or Firm* — Oblon, Spivak, McClelland, Maier & Neustadt, L.L.P.

(57) ABSTRACT

A transfer chamber is partitioned into a second chamber in which a transfer robot moving through an opening portion which can be opened/closed by a door is arranged, and a minute first chamber which serves as a FIMS system and includes a door capable of retaining a lid of a pod. The second chamber maintains a state in which an inert gas constantly circulates owing to minute nitrogen while having a pressure higher than that inside the first chamber. The first chamber is normally sealed while an oxide gas is suppressed in advance. In addition, at a time of transferring wafers, a partial pressure of the oxide gas is lowered with use of a downflow which is caused by the inert gas. Further, the first chamber and the second chamber are communicated with each other after a level of the partial pressure is confirmed with use of an oxygen level meter. As described above, an existing amount of the oxide gas is reduced in the so-called transfer chamber in semiconductor processing equipment in which the FIMS system is secured.

6 Claims, 3 Drawing Sheets

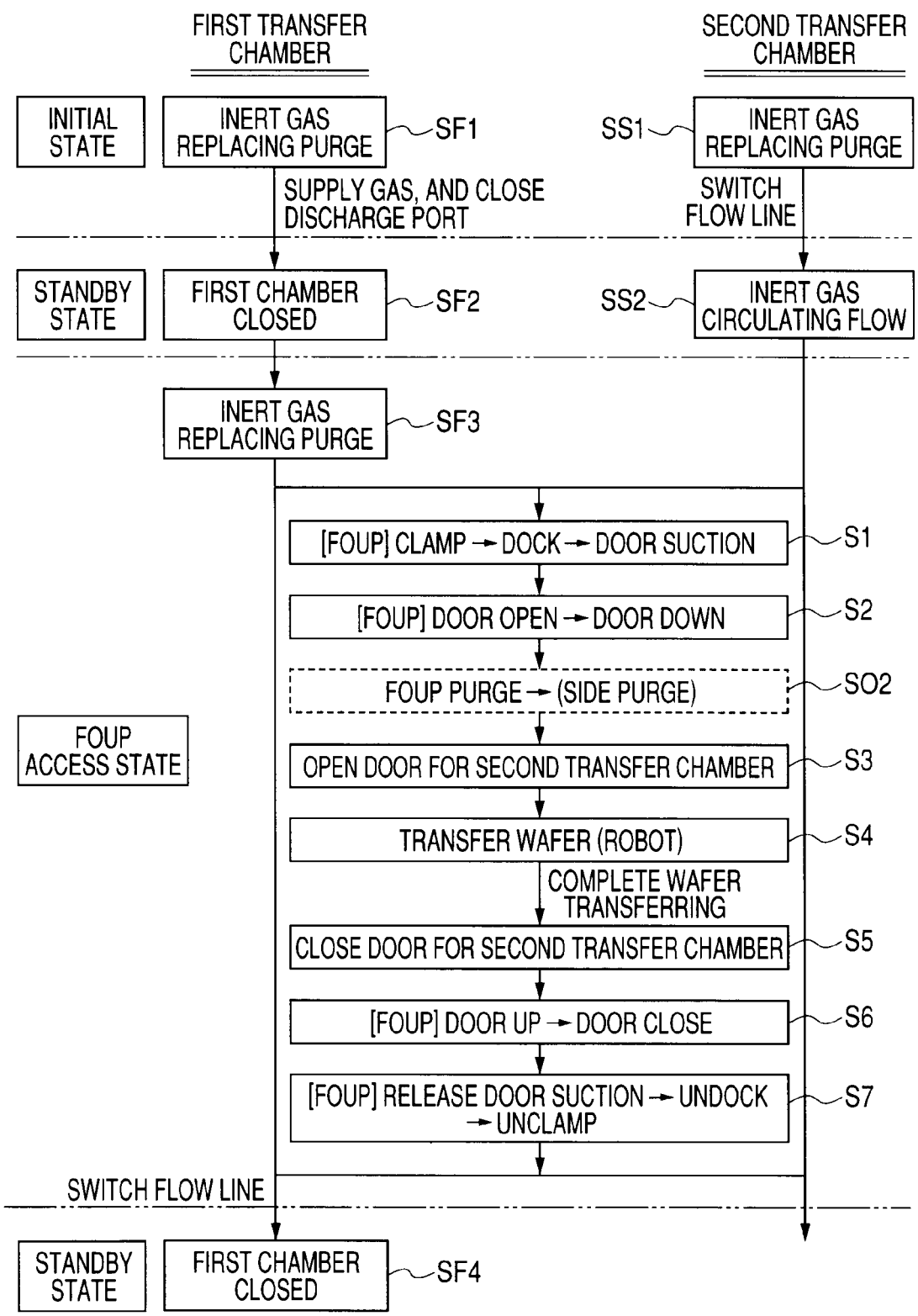

CONTAINED OBJECT TRANSFER SYSTEM

This application claims priority from Japanese Patent Application No. 2008-137946 filed on May 27, 2008, which is hereby incorporated by reference herein.

BACKGROUND OF THE INVENTION

1. Field of the Invention

The present invention relates to a so-called front-opening interface mechanical standard (FIMS) system used when, in a semiconductor manufacturing process or the like, contained objects (objects to be stored) including wafers, which are retained inside transfer containers called pods, are transferred between semiconductor processing apparatuses, and relates to an object to be stored transfer system in which the objects to be stored are transferred between semiconductor processing apparatuses or the like. In particular, the present invention relates to an object to be stored (wafer) transfer system including a FIMS system in which pods which are so-called front-opening unified pods (FOUP) serving as sealed containers for housing wafers are mounted and lids of the pods are opened/closed so as to transport the wafers to the pods, and a transfer chamber which is a mini-environment connected to the FIMS system and in which a robot for transporting the wafers needs to be provided.

2. Description of the Related Art

Up to now, a semiconductor manufacturing process has been conducted in a so-called clean chamber in which semiconductor wafers are treated with high cleanliness maintained therein. However, in order to cope with an increase in wafer size and to reduce a cost necessary for maintenance of the clean chamber, a method of maintaining only the following in a highly clean state is employed in recent years, an inside of a processing apparatus, the pod (container of wafer), and a mini-environment in which a transporting robot for transferring the wafer from the pod to the processing apparatus is housed.

The pod includes a substantially cubic body having a rack capable of retaining multiple wafers therein in a state in which the wafers are separated from each other in parallel and having an opening which is used for putting in/taking out wafers on one of surfaces constituting an outer surface, and a lid for closing the opening. A pod in which a surface provided with the opening is located not on a bottom surface of the pod but on a side surface of the pod (in front of the mini-environment) is collectively referred to as a front-opening unified pod (FOUP). The present invention is mainly intended for a structure using the FOUP.

The above-mentioned mini-environment includes a first opening portion faced with the opening of the pod, a door for closing the first opening portion, a processing-equipment-side second opening portion which is provided on the semiconductor processing equipment side, a transporting robot which intrudes from the first opening portion to the inside of the pod for retaining the wafer and passes and transfers the wafer through the processing-equipment-side second opening portion to the processing equipment side. Simultaneously, the structure forming the mini-environment includes a placing base for supporting the pod such that the pod opening portion is opposed to the front of the door.

On the upper surface of the placing base, there are arranged a positioning pin which is fitted to a hole for positioning provided in the lower surface of the pod so as to define the placing position of the pod, and a clamping unit which is engaged with a clamped portion provided in the lower surface of the pod so as to secure the pod with respect to the placing base. Normally, the placing base is movable back and forth with respect to a door direction by a predetermined distance. When the wafers in the pod are transported to the processing equipment, the pod is moved in a state of being placed until the lid of the pod is brought into contact with the door. After that contact, the lid is removed from the opening of the pod by the door. With those operations, the inside of the pod and the inside of the processing equipment are communicated with each other through an intermediation of the mini-environment. Subsequently, a wafer transporting operation is repeated. A system including the placing base, the door, the first opening portion, a door opening/closing mechanism, a wall which constitutes a part of the mini-environment including the first opening portion is collectively referred to as a front-opening interface mechanical standard (FIMS) system.

In this case, the inside of the pod in a state of containing wafers or the like is normally filled with dry nitrogen or the like which is controlled in a highly clean state, and hence contaminants, an oxidized gas, and the like are prevented from intruding to the inside of the pod. However, when the wafers in the pod are brought into various processing apparatuses so as to undergo a predetermined process, the inside of the pod and the inside of the processing equipment are constantly communicated with each other. In the structure as described above, which is exemplified in Japanese Patent Application Laid-Open No. 2006-019726, the fan and the filter are arranged in the upper portion of the chamber in which the transporting robot is arranged, and the clean air which has undergone particle control is normally introduced to the inside of the chamber. However, when the air as described above intrudes to the inside of the pod, there is a risk that oxygen and moisture in the air oxidize the surface of the wafer.

In accordance with the development of smaller and higher-performance semiconductor devices, consideration is started to be given on oxidization caused by oxygen and the like which intrudes to the inside of the pod, which has not conventionally constituted a serious problem. Those oxidized gases form extremely thin oxide films on the surface of the wafer or the layers of various types formed on the wafer. Owing to the existence of the oxide films as described above, there arises a risk that desired properties cannot be ensured in ultra-small semiconductor devices. As a countermeasure therefor, it is probable that the gas which has not undergone control on an oxygen partial pressure is prevented from intruding from the outside of the pod to the inside of the pod. Specifically, Japanese Patent Application Laid-Open No. 2003-045933 discloses a structure in which a supply nozzle and a suction nozzle for the gases are provided in a region adjacent to an opening of the pod in a FIMS system so as to form an airflow film which substantially close the opening of the pod. The airflow film thus formed prevents the external air from intruding to the inside of the pod.

However, with respect to the so-called mini-environment in which the transporting robot is arranged, normal air which has merely undergone control on dust and the like is supplied through an intermediation of the filter. Accordingly, when the wafers are conveyed out of the pod or when conveyed into the pod, the wafers constantly pass the environment which has not undergone oxide gas control. Actually, the transfer operation is performed within an extremely short period of time, and hence does not constitute a serious problem in the present semiconductor manufacturing process. However, in a phenomenon such as dew condensation, moisture and the like can adhere to the surfaces of the wafers even within a short period of time. In addition, it is difficult to suppress the oxidation of various thin films once moisture and the like adhere thereto.

SUMMARY OF THE INVENTION

Under the above-mentioned circumstances, an object of the present invention is to provide a transfer system of wafers as objects to be stored, which is capable of suppressing, even after pods are opened and even when the wafers are transferred, a partial pressure of an oxide gas such as oxygen in a space where the wafers exist to a predetermined low level. Specifically, it is the object of the present invention to provide a transfer system in which there are performed operations of opening lids of the pods for containing the wafers, taking out the wafers from the pods and sending the wafers to processing equipment, and conveying the wafers sent from the processing equipment into other pods again, and which is capable of performing the operations in the environment in which the oxide gas is reduced as much as possible.

In order to achieve the above-mentioned object, a transfer system according to the present invention is provided with a container including:

a substantially box-shaped body which is capable of containing an object to be stored and has an opening on one surface thereof; and a lid which is separable from the body and closes the opening so as to form a sealed space together with the body, the lid being detached from the container, whereby the opening is opened so that the object to be stored can be inserted and taken out, the object to be stored being transported between the container and a processing chamber in which the object to be stored is processed, the transfer system comprising:

a placing base on which the container is placed;

a first chamber which is arranged adjacently to the placing base and comprises a first opening portion opposed to the container which is placed on the placing base, and is configured to be communicated with an inner space of the container through an intermediation of the first opening;

a first door which is capable of closing the first opening portion and retaining the lid of the container;

a first inert-gas supply system which is capable of supplying an inert gas to an inside of the first chamber through a first control valve;

a first discharge system which is capable of discharging gas existing in the inside of the first chamber through a second control valve;

an oxygen level meter for measuring an amount of an oxide gas existing in the inside of the first chamber;

a second chamber which is arranged adjacently to the first chamber, capable of being communicated with the first chamber through an intermediation of a second opening portion, and capable of being communicated with the processing chamber through an intermediation of a third opening portion;

a second door which is capable of closing the second opening portion;

a second inert-gas supply system which is capable of supplying the inert gas to an inside of the second chamber;

a second discharge system which is capable of discharging gas existing in the inside of the second chamber;

a transfer robot which is arranged in the inside of the second chamber, for transferring the object to be stored between the inside of the container and the processing chamber; and a control device for controlling an opening/closing operations of the first control valve and the second control valve, and an amount of the inert gas supplied by the first inert-gas supply system and an amount of the gas discharged by the first discharge system, in accordance with a process condition of the transfer system and a measurement result of the oxygen level meter for the first chamber.

Note that, in the above-mentioned transfer system, it is desirable that the second chamber comprises a circulation system which is branched from the second discharge system and is connected with the second inert-gas supply system, for circulating the inert gas discharged from the inside of the second chamber so as to generate a down flow in the inside of the second chamber through an intermediation of the second inert-gas supply system, and the control device selectively executes the discharge of the inert gas by the second discharge system or the circulation of the inert gas by the circulation system. Further, it is desirable that the first discharge system comprise a forcible discharge system which is capable of generating, in the inside of the first chamber, a negative pressure lower than an atmosphere pressure. In addition, in a state in which the first door closes the first opening portion, when it is confirmed by the oxygen level meter that the amount of the oxide gas in the inside of the first chamber is equal to or lower than a predetermined value, the apparatus desirably causes the first chamber to be a closed space by stopping at least one of the first inert-gas supply system and the first discharge system. Further, it is desirable that the transfer system further includes a plurality of the first chambers so as to execute transferring processes of the object to be stored, in parallel, in which: each of the first chambers has the first opening with the first door; the second chamber comprises a plurality of the second opening portions and a plurality of the second doors correspondingly to the plurality of the first chambers and used for closing the second opening portions respectively, so as to communicate with the respective first chamber thorough the intermediation of the corresponding second opening; the first inert-gas supply system is configured to supply the inert gas into each of the plurality of the first chambers through the corresponding first control valve; the first discharge system is configured to discharge the gas existing in the inside of each of the plurality of the first chambers through the respective second control valve; and the oxygen level meter is configured within each of the plurality of the first chambers to measure the amount of the oxide gas existing in the inside of each of the plurality of the first chamber; and the control device independently controls opening/closing operations of the first control valve and the second control valve, and an amount of the inert gas supplied by the first inert-gas supply system and an amount of the gas discharged by the first discharge system, of the respective first chamber, on the basis of the process condition of the transfer system and the measurement result of the oxygen level meter for each of the plurality of the first chamber, so as to execute transferring processes of the object to be stored in the each of a plurality of the containers, in parallel. Further, it is desirable that the transfer system further includes a purge nozzle which is arranged around the first opening portion and capable of supplying, in a state in which the inside of the first chamber and the inside of the container are communicated with each other, an inert gas while having directivity toward the inside of the container.

According to the present invention, a space in which the transfer robot for transferring the object to be stored exists can be constantly filled with the inert gas which is obtained by controlling a so-called oxide gas such as dry nitrogen. Accordingly, oxidation of various structural films during transfer, which has constituted a problem in the conventional structures, can be largely suppressed. Further, when the gas introduced into the transfer chamber is merely changed to an inert gas such as nitrogen in the conventional structures, there arise a problem that a huge amount of the inert gas is used, and a problem with how to treat the inert gas introduced into the chamber. However, according to the present invention, the transfer chamber is partitioned into the first chamber and the second chamber, and a so-called inert-gas purge is performed with use of only the first chamber having a spatial volume which is remarkably smaller than that of the other chamber so that the lid of the container is opened/closed. Normally, in this operation of the inert-gas purge, use of a large amount of inert gas is demanded. In this context, the operation is performed in a small space, whereby a total use amount of the inert gas can be suppressed, and the above-mentioned object can be achieved.

Further, according to the present invention, the first chamber and the second chamber are not communicated with each other until an oxygen level in the inside of the first chamber is monitored to have reached a predetermined low oxygen level. Accordingly, when the wafers are transferred, the oxygen level of the second chamber can be constantly maintained to be equal to or lower than a predetermined oxygen level. Further, in the present invention, through monitoring of the oxygen level in the inside of the first chamber, an amount of the oxide gas which is brought from the first chamber to the second chamber is constantly suppressed to a low level. Therefore, when a downflow is generated in the second chamber, the inert gas such as nitrogen for the second chamber circulates to be used, and reduction of the oxide gas is achieved by supplying new inert gas only when an increase of the oxide gas is confirmed. Accordingly, even when a downflow having a sufficient flow rate is formed in the second chamber, a use amount of the inert gas such as nitrogen can be minimized.

Further, according to the present invention, a nitrogen purge in the pod and the like can be performed with use of only the first chamber having a small spatial volume. During a purge operation, the whole space of the first chamber and the inside of the pod is completely sealed, and when necessary, the inert gas such as nitrogen is sufficiently supplied in addition to a discharge of gas in the inside thereof. Accordingly, it is also possible to remarkably reduce the time necessary for lowering the oxygen level in the space when compared with that in the conventional structures.

Further features of the present invention are become apparent from the following description of exemplary embodiments with reference to the attached drawings.

BRIEF DESCRIPTION OF THE DRAWINGS

FIG. 2 is a flowchart illustrating actual operations of the object to be stored transfer system according to the embodiment of the present invention.

DESCRIPTION OF THE EMBODIMENT

Figure 1A:
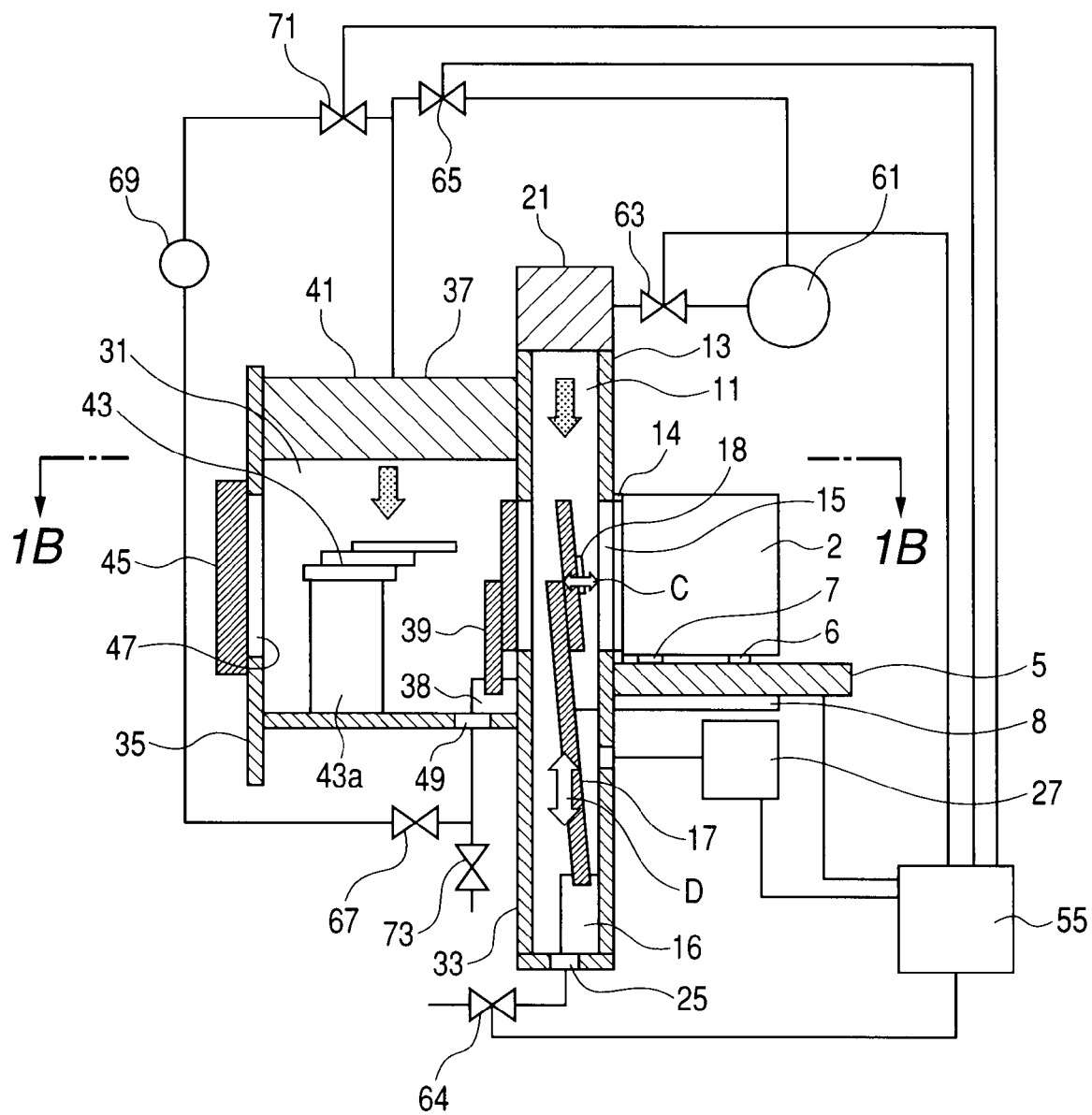
FIG. 1A schematically illustrates an outline of the structure of a main portion of an object to be stored transfer system according to an embodiment of the present invention.
Figure 1B:
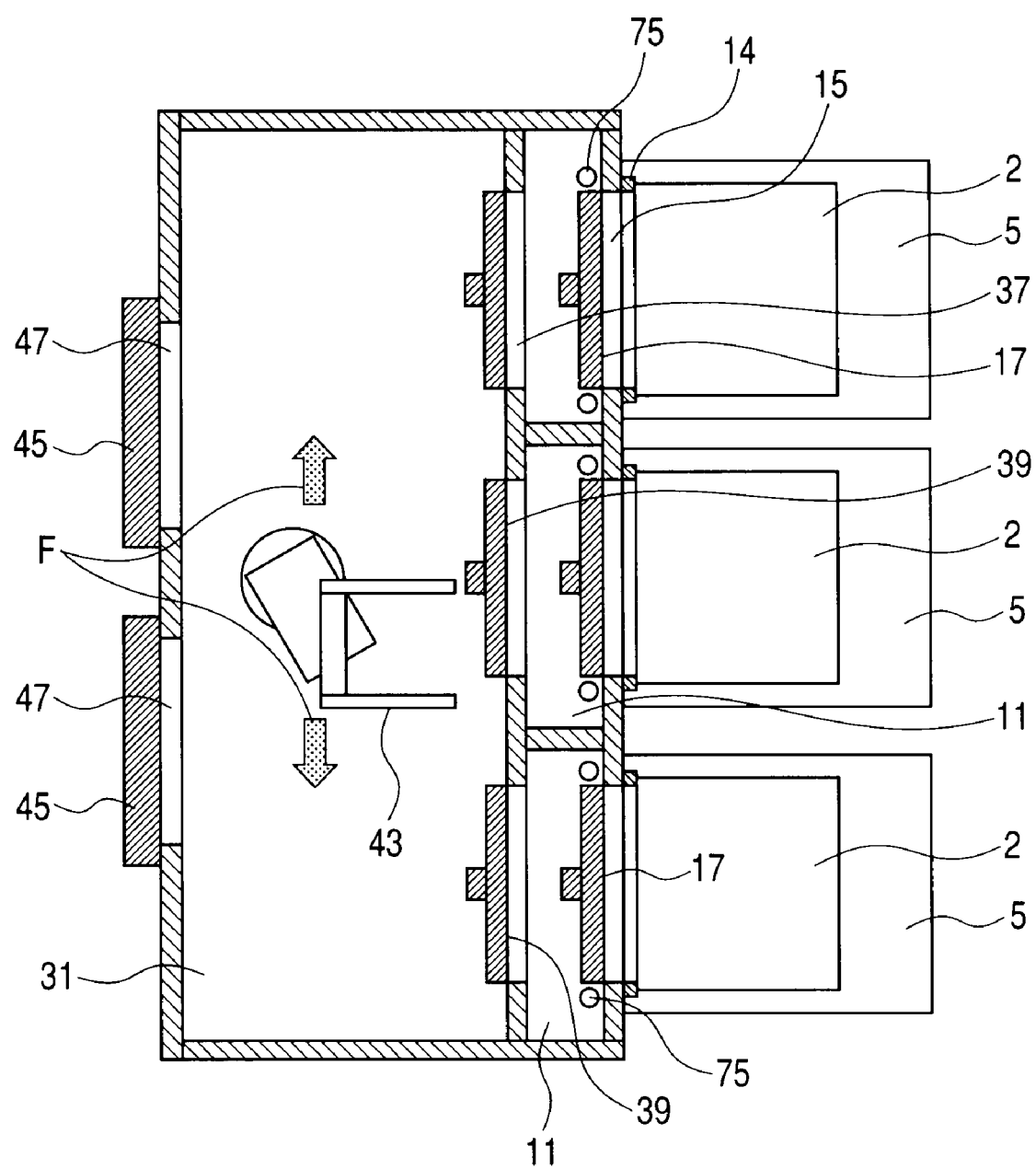
FIG. 1B schematically illustrates an outline of the structure thereof, which is seen from an upper side of a cross-section taken along the line 1B-1B in FIG. 1A.

In the following, an embodiment of the present invention is described with reference to the drawings. FIG. 1A illustrates an outline of a structure of a main portion of a transfer system of a wafer according to a first embodiment of the present invention, the wafer being an object to be stored. That is, the outline thereof is schematically illustrated in a state of viewing a cross-section obtained by cutting the following in the vertical direction, the above-mentioned structure of FIMS, structures of a mini-environment, a transfer robot, and the like, and other structures added in the present invention along with those structures. Further, FIG. 1B schematically illustrates an upper side of the main portion of the system in a state of being cut along the line 1B-1B in FIG. 1A. Note that, actually, structures including a placing base and doors of the FIMS part in the figure are accompanied by various structures for driving those structures. However, basically, structures of those driving systems and the like do not directly relate to the present invention, and can be replaced by driving systems including a so-called well-known fluid cylinder. Therefore, detailed description and illustration thereof are omitted herein. Further, while examples of an inert gas described in the following configuration generally include nitrogen or argon, it is unnecessary to impose specific limitations thereon as long as oxide gases are excluded.

In this context, a pod as a container and wafers as objects to be stored in the pod in the present invention are described in advance. Inside the body of the pod, there is formed a space for accommodating the wafers in the inside thereof. The body has a substantially box-like shape in which one of the surfaces existing in the horizontal direction has a substantially rectangular opening. Further, the pod is provided with a lid for sealing the opening of the body as a separate member with respect to the body. Inside the body, there is arranged a rack having multiple steps for horizontally maintaining multiple wafers and superimposing the same in the vertical direction when the pod is placed on the horizontal surface in a normal state. The wafers placed on the rack are contained inside the pod body at predetermined intervals.

A wafer transfer system 1 of the present invention includes a placing base 5 on which a pod 2 is loaded, a first chamber 11 and a structure along with the first chamber, a second chamber 31 and a structure along with the second chamber, and a control device (also herein referred to as an apparatus) 55 for collecting pieces of information from those structures and controlling those structures. The first chamber 11 has a first partition wall 13, a first opening portion 15, a first door 17, a first inert-gas supply system 21, a first discharge port 25, and an oxygen level meter 27. Further, the second chamber 31 has a second partition wall 33, a third partition wall 35, a second opening portion 37, a second door 39, a second inert-gas supply system 41, and a transfer robot 43. The third partition wall 35 is provided with a third opening portion 47 so as to be capable of being communicated with a processing chamber (not shown) through an intermediation of the processing chamber-door 45.

The placing base 5 has a positioning means 6 including a pin and capable of cooperating with the structure arranged on the lower surface of the pod such that the pod 2 placed on the upper surface thereof can be secured at a predetermined position, and a securing means 7 including a clamping member. The pod 2 is placed on the placing base such that the opening thereof is opposed to the first opening portion 15 on the first chamber 11 side at a predetermined interval and at the predetermined position. The placing base 5 further has a pod driving mechanism 8 for causing the pod 2 to approach or be separated with respect to the first opening portion 15. The pod 2 loaded at a predetermined position on the placing base 5 is moved by the pod driving mechanism 8 toward the first opening portion 15. In this case, when the apparatus 55 detects a state in which the pod 2 is placed on the placing base 5, the apparatus 55 determines that a wafer transfer operation is to be carried out, and execution of various operations described later for transferring the wafers in a suitable environment is promoted. Accordingly, the placement of the pod 2 is regarded as an operation for generating a signal for starting the wafer transfer operation in this embodiment. Note that, while being structures essential for a wafer transfer system, those positioning means 6, securing means 7, and pod driving mechanism 8 are not characteristic structures of the present invention as described above, and various modifications can be made thereto. Thus, illustration thereof is simplified in FIGS. 1A and 1B, and description of specific structures is omitted as well.

The first opening portion 15 has a size allowing the lid for closing the opening of the pod 2 to pass therethrough and allowing the first opening portion 15 to be opposed with respect to the outer peripheral surface of the wall around the opening of the body of the pod 2. Further, around the first opening portion 15, in other words, on the surface on the outer space side thereof, there is arranged a sealing member 14. The sealing member 14 includes a rubber ring-like member referred to as a so-called o-ring. The first door 17 is movable between an initial state of closing the first opening portion 15 and a containing state of completely opening the first opening portion 15. Further, the first door 17 has a lid holding mechanism 18 for holding the lid on the contact surface with respect to the lid. In the initial state, when the lid of the pod 2 is brought into contact with the first door 17, the door 17 holds the lid, and separates the lid from the pod 2 secured on the placing base 5 before retracting together with the lid to the position substantially directly above the containing portion. Further, in this stage, the outer peripheral surface of the opening of the pod 2 closed by the lid (surface opposed to the outer space side surface of first partition wall 13) is brought into close contact with the surface of the first partition wall 13 through an intermediation of the sealing member 14 so as to seal the whole space of the inside of the first chamber 11 and the inner space of the pod 2. At the time of separation and re-attachment of the lid, the door 17 moves along the arrow C indicated in the figure, and moves along, in a state of separating the lid, the arrow D indicated in the figure to the containing position. The movements along the directions indicated by the arrows C and D are performed by the first door-driving mechanism 16 connected to the first door 17.

The first inert-gas supply system 21 is connected to the inert-gas supply source 61 through an intermediation of a first supply-amount control valve 63. The above-mentioned apparatus 55 controls the first supply-amount control valve 63 so as to control a supply amount of an inert gas and presence and absence of the supply thereof with respect to the first chamber 11. The first inert-gas supply system 21 is capable of emitting an inert gas from the entire upper surface of the first chamber 11 such that a downflow from the chamber upper portion to the chamber lower portion can be formed inside the first chamber 11. Note that, the inert gas is distributed to the first inert-gas supply system 21 through a single tube-like member and the first supply-amount control valve. The inert-gas supply system 21 is constituted such that, through interposition of a so-called branch pipe, dispersion plate, or the like in a process of connecting the gas pipe which extends from the tube-like member to the first chamber 11, the inert gas can be supplied in a shower-like manner from substantially the entire upper surface of the first chamber 11. Note that, while a suitable embodiment mode of the inert-gas supply system 21 is illustrated in this embodiment, the inert-gas supply system 21 can be constituted in various configurations as long as a so-called downflow can be generated, which is caused by the inert gas which flows from the upper portion of the first chamber 11 to the lower portion of the first chamber.

Further, on the lower side of the first chamber 11, there is provided a first discharge port 25 operating as an embodiment mode of a first discharge system which is capable of discharging gas having an amount comparable to an amount of the inert gas supplied from the first inert-gas supply system 21. The first discharge port 25 is connected to a pump or the like through an intermediation of a first discharge valve 64 serving as a part of the first discharge system. The first discharge valve 64 controls a discharge rate of gas from the first discharge port 25 or opens/closes the first discharge port 25. Further, as described above, the oxygen level meter 27 is attached to the first chamber 11. The oxygen level meter 27 measures an oxygen concentration in gas or a concentration of an oxide gas which exist in the space inside the first chamber 11 or in the whole space of the inside of the first chamber 11 and the inside of the pod 2. Further, the oxygen level meter 27 is connected to the apparatus 55, and the apparatus 55 controls the first supply-amount control valve 63 and the first discharge valve 64 on the basis of signals regarding the oxygen concentration, which are sent from the oxygen level meter 27 to the apparatus 55. Further, the apparatus 55 simultaneously maintains the pressure inside the first chamber 11 to be higher than the pressure of the outer space, that is, the atmosphere pressure.

In this embodiment, the first discharge valve 64 controls the flow amount of the gas discharged from the first discharge port 25. That is, a state is achieved in which, the gas existing in the space in the first chamber 11 or the space constituted by the inside of the first chamber 11 and the inside of the pod 2 is pushed out to be discharged in accordance with an inert gas supplied with respect to the above-mentioned space, and thus achieved the state is maintained, whereby the oxide gas inside the space is discharged or reduced. Accordingly, in a state in which the lid of the pod 2 is opened/closed, that is, in a state in which a content of the oxide gas inside the space, it is desirable that much inert gas be rapidly introduced to the inside of the space. Further, the inert gas supplied from the first inert-gas supply system 21 generates gas flow from the upper portion of the first chamber 11 to the lower portion thereof in a single direction, and hence, basically, the gas flow is probably improper for operations of discharging and replacing the gas inside the pod 2. Thus, in this configuration, around the first opening portion 15, there is arranged a purge nozzle 75 for a so-called purge operation, which is capable of supplying a large amount of inert gas from its position to the inside of the pod 2.

The first door 17 separates the lid from the body of the pod 2 so as to communicate the inside of the pod and the space inside the wafer transfer system with each other. The first chamber 11 is provided for separating the operational space of the first door 17 at that time from the second chamber 31 serving as a space in which the transfer robot 43 is arranged and for ensuring the operational space. Accordingly, it is enough that the first chamber 11 has a thickness including an error between a movement span to the inside of the chamber in accordance with the separating operation of the lid and an actual movement, a width sufficient for closing the first opening portion 15, and a depth sufficient for ensuring the space in which the first door 17 is accommodated at the time of opening the first opening portion 15. Accordingly, as illustrated in FIG. 1B, when the wafer transfer system corresponds to the multiple pods 2, the first chambers 11 are provided correspondingly to the individual placing bases 5 on which the pods 2 are placed. Note that, while being structures essential for the wafer transfer system of the present invention, the first door-driving mechanism 16 for driving the first door 17 in the directions C and D and the lid holding mechanism 18 provided to the first door 17 are not characteristic structures of the present invention and can be variously altered to a fluid cylinder and the like. Thus, illustration thereof is simplified in FIGS. 1A and 1B, and description of specific structures is omitted as well.

Each of the second opening portions 37 has a size sufficient for the transfer robot 43 which performs insertion and taking out of wafers with respect to the inside of the pod 2 and performs insertion and taking out of the wafers with respect to a processing chamber continuous therewith. The second opening portion 37 basically has a size equal to that of the first opening portion 15, and is arranged at a position of being opposed to the first opening portion 15. With respect to each of the second opening portions 37, the second door 39 which moves between two positions at which the second opening portion 37 is respectively closed and opened is arranged. The second door 39 is driven by a second door-driving mechanism 38. Note that, while being structures essential for the wafer transfer system of the present invention, the second door-driving mechanism 38 is not a characteristic structure of the present invention and can be variously altered to a fluid cylinder and the like. Thus, illustration thereof is simplified in FIGS. 1A and 1B, and description of specific structures is omitted as well.

In a state in which the second door 39 exists at a position of closing the second opening portion 37, a sealing member (not shown) is arranged on the outer peripheries of the door 39 and the second opening portion 37, in other words, on the side surface of the second chamber 31 side of the second partition wall 33. That is, similarly to the relationship between the first door 17 and the first opening portion 15, when the second opening portion 37 is closed, the second chamber 31 and the first chamber 11 are completely and spatially separated from each other. Accordingly, even when an existing amount of the oxide gas inside the first chamber 11 is increased in accordance with opening/closing of the lid of the pod 2, the intrusion of the oxide gas with respect to the second chamber 31 is prevented. Note that, in this embodiment, in terms of preventing gas disturbance and the like involved with opening/closing of the second door 39, the pressure inside the first chamber 11 and the pressure inside the second chamber 31 are set to be substantially equal to each other. However, differences in pressure may be set among the second chamber 31, the first chamber 11, and the outer space such that gas flow from the space of small existing amount of the oxide gas to the space of large existing amount of the oxide gas may not be generated.

At the center of the second chamber 31, the transfer robot 43 which actually transfers the wafers is arranged. The transfer robot 43 is capable of moving a robot arm, which extends in the horizontal direction, in parallel in the perpendicular direction such that the robot arm can be inserted below each of the wafers which are arranged in the perpendicular direction inside the pod 2. Further, in this embodiment, insertion and taking out of the wafers are performed with respect to a single processing chamber, and hence the transfer robot 43 is arranged so as to enable to be opposed to the third opening portion 47 which communicates the second chamber 31 and the processing chamber with each other at the initial position. The transfer robot 43 has a movement device 43a which enables the transfer robot 43 to move in the directions in which the first chamber 11 is provided in parallel therewith with reference to the initial position (directions indicated by arrows F in the figure). The third opening portion 47 is closed by the processing chamber-door 45. A decompressed environment such as a so-called vacuum is generated in the processing chamber, and various processes are performed thereunder. Thus, in the periphery of the processing chamber-door 45 and the third opening portion 47, in other words, even in a region in which a pair of the third partition wall 35 and the door 45 are faced with each other, a sealing member (not shown) is arranged so as to completely seal the third opening portion 47, to thereby separating the second chamber 31 and the processing chamber from each other. Further, the second door 39 and the processing chamber-door 45 are allowed to exist at an opening/closing position, whereby the second chamber 31 can be formed as a sealed space.

The second inert-gas supply system 41 is arranged on the upper surface of the second chamber 31. The second inert-gas supply system 41 is connected to the inert-gas supply source 61 through an intermediation of a second supply-amount control valve 65. Note that, an inert gas is distributed to the system through a single tube-like member. The inert-gas supply system 41 is constituted such that, through interposition of a so-called branch pipe, dispersion plate, or the like in a process of connecting the gas pipe which extends from the tube-like member to the second chamber 31, the inert gas can be supplied in a shower-like manner from substantially the entire upper surface of the second chamber 31. Note that, while a suitable embodiment mode of the inert-gas supply system 41 is illustrated in this embodiment, the inert-gas supply system 41 can be constituted in various configurations as long as a so-called downflow can be generated, which is caused by the inert gas which flows from the upper portion of the second chamber 31 to the lower portion of the second chamber. Further, dust and the like generated in the transfer robot 43, for example, is brought by the inert gas to a path from the second chamber 31 to the second inert-gas supply system 41. Accordingly, in order to eliminate dust and the like as described above, a filter for removing dust and the like may be added to the second inert-gas supply system 41.

Further, on the lower side of the second chamber 31, there is arranged a second discharge port 49. The second discharge port 49 is connected to a circulation path operating as a circulation system according to the present invention, in which gas passes a second discharge valve 67, a circulation pump 69, and a check valve 71 in the stated order, and then returns to the second inert-gas supply system 41, and is connected to a discharge path operating as a second discharge system according to the present invention, in which gas is discharged from a third discharge valve 73 to the outer space for the purpose of directly discharging gas in the second chamber 31 to the outer space. The second discharge valve 67 and the third discharge valve 73 are capable of opening/closing in response to instructions from the apparatus 55, which are made in accordance with the mode of gas supply with respect to the chamber 31 and the like. At the time of a so-called start-up operation of the system, the discharge path for discharging the gas inside the second chamber 31 from the third discharge valve 73 to the outer space is used. That is, with use of a high flow volume of inert gas which is supplied to the inside of the second chamber 31 through the second supply-amount control valve 65, an operation for replacing the gas existing inside the second chamber 31 with the inert gas is performed. The operation is performed for a predetermined period of time, whereby an existing amount of the oxide gas inside the second chamber 31 is set to a level equal to or lower than a predetermined value for the second chamber.

When the circulation path is used, the second supply-amount control valve 65 is basically closed, and a circulating flow of an inert gas passing the second chamber 31 is generated by the circulation pump 69. The present invention is based on the premise that, after the time of initial system start-up, basically, an amount of the oxide gas does not increase after the existing amount of the oxide gas inside the second chamber 31 reaches a level equal to or lower than a predetermined value for the second chamber. However, the transfer robot 43 performs a transfer operation inside the second chamber, and hence it is necessary to constantly generate a downflow for the purpose of coping with generation of dust. The downflow is generated with use of the circulating flow of the inert gas as described above, whereby it is possible to minimize a use amount of the inert gas in the second chamber 31.

Further, owing to an oxide gas flowing-in from the first chamber 11, that is, owing to a so-called leakage and the like while the amount thereof is minute, even when the sealed state is normally maintained, the total amount of the oxide gas inside the second chamber 31 is increased over time. In the present invention, in order to cope with the case, the total amount of the oxide gas is measured with use of the oxygen level meter 27 in a state in which the first chamber 11 and the second chamber 31 are communicated with each other. When the measurement result exceeds a predetermined value for the second chamber, the apparatus 55 closes those circulation paths and supplies a high flow volume of inert gas from the second supply-amount control valve 65 while the oxide gas is discharged from the discharge path through an intermediation of the third discharge valve 73. Through the operation, the operation for replacing the gas existing inside the second chamber 31 with a new inert gas is performed. With this operation, an existing amount of the oxide gas inside the second chamber 31 is suppressed again to a level equal to or lower than a predetermined value for the second chamber. Note that, when the high flow volume of inert gas is supplied from the second supply-amount control valve 65, there is a fear that the inert gas flows back into the circulation path. However, in this configuration, the flowing-back is prevented with the so-called check valve 71 arranged in the path.

Note that, in this configuration, a discharge device such as a pump is not particularly arranged on the downstream of the third discharge valve 73. However, in terms of shortening the time for starting-up and an amount of the inert gas necessary at the time of start-up, the discharge device may be used. Further, the discharge path may be replaced with the path which is constituted by the second opening portion 37, the first chamber 11, and the first discharge port 25 so as to reach the outside. Further, the processing chamber-door 45 may be opened such that the discharge path can be used while being replaced with a process gas discharge system which is inevitably provided on the processing chamber side and involves a large displacement. In this case, only the above-mentioned circulation path constitutes the inert gas discharge system directly arranged with respect to the second chamber 31, and an inert gas discharge configuration over the entire lower surface of the second chamber 31 is easily structured.

Next, an actual operational flow of the system of the present invention is described with reference to a flowchart of FIG. 2. When an initial state represented by "INITIAL STATE" is obtained (at the time of so-called device start-up), the first door 17 and the second door 39 are in a state of closing the first opening portion 15 and the second opening portion 37, respectively. While the state is maintained, a mode of supplying an inert gas from the second supply-amount control valve 65 is selected, whereby a purge is performed inside the second chamber 31 with use of nitrogen. Note that, in this configuration, in order to rapidly discharge dust and the like in the inside of the second chamber 31 to the outside, the above-mentioned processing chamber-door 45 is moved for fully opening the third opening portion 47 so that the discharge system on the processing chamber side is used. When an inert gas is introduced to the inside of the second chamber 31 at a high flow volume and is discharged in the state, minute particles such as dust existing in the chamber and oxide molecules existing in the chamber and adhering to the wall in the chamber can be discharged to the outside of the chamber. The above-mentioned operations are represented by Step SS1 in FIG. 2.

After the operations are performed for a predetermined period of time, or after the partial pressure of the oxide gas in the chamber, which has become equal to or lower than a predetermined value, is confirmed with use of the oxygen level meter 27 existing in the first chamber 11, the third opening portion 47 is closed by the processing chamber-door 45 such that the second chamber 31 is formed as a sealed space. Then, the second supply-amount control valve 65 is closed, and switching to a mode of using the above-mentioned inert gas circulation system is performed. Note that, a second oxygen level meter (not shown) may be directly coupled, for example, with respect to the second chamber 31 such that, after the partial pressure of the oxide gas, which has become equal to or lower than a predetermined value, is confirmed with use of the second oxygen level meter, the third opening portion 47 is closed by the processing chamber-door 45 so as to form the second chamber 31 as a sealed space. In the subsequent standby state, an inert gas is supplied to the second chamber 31 with use of the circulation pump 69 at a low flow volume. With those operations, a downflow caused by the inert gas is generated in the chamber, and a so-called cleaning state is maintained in which the existing amount of the oxide gas after the purge is suppressed and microparticles are discharged (Step SS2). The operations represented by Step SS2 are constantly performed except a state in which the condition of the environment in the second chamber 31 should be maintained, that is, except when the partial pressure of the oxide gas in the second chamber 31 rises to be equal to or larger than a second predetermined value at the time of device start-up.

With respect to the first chamber 11, an inert gas is supplied from the first inert-gas supply system 21 at a high flow volume, and dust and the like inside the first chamber 11 are cleaned by a downflow of the inert gas (Step SF1). After the operation is performed for a predetermined period of time, or after the oxygen partial pressure in the chamber, which has become equal to or lower than a predetermined value, is confirmed with use of the oxygen level meter 27, the first discharge valve 64 is closed such that the first chamber 11 is formed as a sealed space. Then, supply of the inert gas from the first inert-gas supply system 21 is stopped, and the space is retained at a pressure slightly higher than a so-called atmosphere pressure in the outer space (Step SF2). Note that, instead of being simultaneously performed, at least one of closure of the first discharge valve 64 and stop of the supply of the inert gas from the first inert-gas supply system 21 may be performed. For example, when only the first discharge valve 64 is closed, a supply pressure of the inert gas is preset with use of the first supply-amount control valve 63, whereby the apparatus 55 stops the supply of the inert gas when the pressure inside the first chamber 11 reaches the supply pressure. In the case of the structure, even when the inert gas inside the first chamber 11 leaks owing to a so-called leakage and the like, the inert gas is appropriately supplied with respect only to the inside of the first chamber 11. Further, when only the supply of the inert gas from the first inert-gas supply system 21 is stopped, in a case where the first inert-gas supply system 21 is provided with a filter or the like, for example, supply of free boron and the like is suppressed by the filter. Until loading of the pod 2 into the system, starting of a processing operation of the wafers 1, and the like are performed, this standby state is normally maintained. Note that, even in the standby state, the oxygen level meter 27 constantly or periodically measures oxygen level inside the first chamber 11. When a measurement value equal to or larger than the first predetermined value as a criterion for an appropriate standby state is obtained thereby, the operations of Steps SF1 and SF2 can be performed again such that the partial pressure of the oxide gas inside the first chamber 11 is suppressed.

When the operation of insertion and taking out of the wafers from the pod 2 is performed, the inert gas is resupplied from the inert-gas supply system 21 into the first chamber 11 and the gas is discharged from the first discharge port 25 again (Step SF3). Along with the operation or immediately therebefore, the pod 2 is placed on the placing base 5. That is, a signal generated when the pod 2 is placed is received by the apparatus 55, and the apparatus 55 performs an operation of Step SF3 at an appropriate timing. The pod 2 is secured by the securing means 7 on the placing base 5 in a clamping manner, and is driven by the pod driving mechanism 8 in the direction of the first opening portion 15 after being secured. When the lid of the pod 2 is brought into contact with the first door 17, the lid is sucked and retained by the lid holding mechanism 18 which is arranged on the first door 17. Note that, in this case, the pod body and the first partition wall 13 are brought into contact with each other through an intermediation of the sealing member 14, the sealing member 14 sealing the region to be sealed with respect to the outer space. After the above-mentioned operations (Step S1) is completed, the first opening portion 15 is opened by the first door 17.

After the first opening portion 15 is opened, the first door 17 is moved by the first door-driving mechanism 16 along an arrow D in FIG. 1A, and retracts to a containing position below the first opening portion 15 (Step S2). Note that, in this embodiment, the following structure is not arranged: in which nitrogen is caused to directly inflow toward the inside of the above-mentioned pod 2 so as to perform a nitrogen purge inside the pod. However, as illustrated in FIG. 1B, when the structure is arranged, a so-called side purge may be performed by the structure after retraction of the first door 17 (Step SO2). After the above-mentioned operations are performed and the partial pressure of the oxide gas inside the first chamber 11, which has become equal to or lower than a certain level (specifically set partial pressure value of the oxide gas in second chamber 31, for example), is confirmed with use of the oxygen level meter 27, the closed state of the second opening portion 37, which has been maintained by the second door 39, is released (Step S3). In this state, an amount of the oxide gas inside the first chamber 11 is decreased to be equal to or smaller than a predetermined amount, that is, smaller than a predetermined value for the second chamber 31. Therefore, even when the first chamber 11 and the second chamber 31 are communicated with each other, the oxide gas inside the second chamber 31 does not increase. Simultaneously, the closed state of the third opening portion 47, which has been maintained by the processing chamber-door 45, is released. With those operations, between the inside of the pod 2 and the processing chamber (not shown), the wafer transfer operation can be carried out by the transfer robot 43.

After the operation represented by Step S3 is performed, a wafer transfer is performed by the transfer robot (Step S4). Normally, when one wafer is transferred to the processing chamber, the processing chamber and the second chamber 31 are partitioned from each other by the processing chamber-door 45, and the wafer is processed. After the completion of the process, the processing chamber-door 45 communicates the processing chamber and the second chamber 31 each other, and an operation of conveying the processed wafer into the pod is performed. Further, in this case, as illustrated in FIG. 1B, when multiple pods are simultaneously loaded in the system, for example, wafers conveyed out of one pod 2 is conveyed into another pod 2 after processing thereon. Normally, a period of time necessary for those operations is shorter than a period of time during which the pods are not secured in the system. Thus, while the above-mentioned operations are carried out, the first chamber 11 and the second chamber 31 are constantly communicated with each other. Note that, when the partial pressures in the first chamber 11 and the second chamber 31 should be managed with higher accuracy, the second door 39 can be closed during each time the transfer robot 43 does not pass through the second opening portion 37.

When the wafer transfer is completed, and all the operations of conveying the wafer out/into the pod 2 are completed, the first chamber 11 and the second chamber 31 are spatially separated from each other by the second door 39. Specifically, the second opening portion 37 is closed by the second door 39 (Step S5). Successively, the first door 17 closes the first opening portion 15, and the lid retained by the door 17 closes the opening of the pod 2 (Step S6). After securing the lid with respect to the opening of the pod 2 is completed, the following are successively performed: release of retention of the lid, retraction of the pod 2 to the placing position, and release of securement of the pod 2 with respect to the placing base, the retention having been maintained by the first door 17 (Step S7). When the above-mentioned operations are completed, processes relevant to the system and with respect to the pod 2 are completed, and the pod 2 is transferred to subsequent processing systems.

When Step S6 described above is completed, the first chamber 11 is spatially separated from the second chamber 31 and the pod 2. Accordingly, inside the first chamber 11, it is less necessary to perform management of the oxide gas. Thus, along with the operation of Step S6, the supply of the inert gas is stopped and the second discharge port 49 is closed, whereby the first chamber 11 shifts to the above-mentioned standby state (Step SF4). In this context, Step SF4 is similar to Step SF2 which corresponds to the previous standby state, and when loading of the pod 2 is performed, the operations of Step SF3 and Steps S1 to S7 described above are performed again.

With the above-mentioned operations, the risk that the inside of the second chamber 31 is contaminated by the oxide gas each time the pod 2 is loaded is remarkably reduced. Further, regarding the lid of the pod 2, which is most liable to bringing dust and the like via the outer space into the clean space, the dust and the like are brought only to the inside of the minute first chamber 11 which is capable of generating a high flow volume of inert gas. In addition, regarding the oxide gas in the chamber, with use of a high flow volume of inert gas which is large for the capacity of the chamber, operations such as replacement, discharge, and the like can be rapidly and reliably performed. Accordingly, inside the second chamber 31, it is unnecessary to generate a downflow which is caused by a high flow volume of flesh inert gas. That is, only by causing the minute inert gas to circulate so as to maintain the pressure inside the second chamber 31 to be higher than that in the first chamber 11, the clean environment of the chamber can be easily maintained. Further, when the wafers move in the first chamber 11, or when the inside of the pod 2 for retaining the wafers is communicated with the inside of the second chamber 31 and the first chamber 11 which are maintained to be clean each other, the partial pressure of the oxide gas inside the first chamber 11 is confirmed with use of the oxygen level meter 27. Therefore, the oxide gas can be prevented from being brought to the inside of the second chamber 31 in advance.

Note that, while the above-mentioned embodiment illustrates three placing bases 5 arranged in parallel, the number of placing bases is not limited thereto. That is, it is sufficient that the first chamber is arranged correspondingly in size to each of the placing bases, and the second chamber 31 which can correspond to some or all of those first chambers 11 is arranged. Similarly, the number of the processing chamber-doors provided to the second chamber is not limited to two in this embodiment. Further, unlike the above-mentioned embodiment, a so-called forcible discharge system constituted by a discharge pump or the like may be arranged on the downstream of the first discharge valve 64. In the case of this embodiment, with use of the sealing member 14 and with the first inert-gas supply system 21 being closed, discharge from the space constituted by the inside of the first chamber 11 and the inside of the pod 2 is performed by the first discharge pump 11. In this case, it is also possible to stop the discharge operation and to supply the inert gas on the premise that the discharge operation is performed for a preset period of time, whereby the pressure in the space is lowered to be equal to or smaller than a predetermined value, and the total amount of the oxide gas in the space is also lowered to be equal to or smaller than a predetermined value. Further, when necessary, a series of those operations, that is, discharge, stop of the discharge operation, introduction of the inert gas, and stop of the introduction of the inert gas after a pressure in the space reaches a predetermined level are repeated, whereby further reduction in existing amount of the oxide gas is achieved. As a result, the oxide gas existing inside the space can be rapidly eliminated from each of the chambers. Note that, while the discharge time in the space is managed on the basis of the elapsed time of the discharge operation in this embodiment, a pressure meter may be arranged with respect to the first chamber 11 for the purpose of detecting a specific pressure such that stop of the discharge operation and the like are performed on the basis of detection results obtained thereby.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A transfer system, which is provided with a container including:
    a substantially box-shaped body which is capable of containing an object to be stored and has an opening on one surface thereof; and
    a lid which is separable from the body and closes the opening so as to form a sealed space together with the body,
    the lid being detached from the container, whereby the opening is opened so that the object to be stored can be inserted and taken out,
    the object to be stored being transported between the container and a processing chamber in which the object to be stored is processed, the transfer system comprising:
    a placing base on which the container is placed;
    a first chamber which is arranged adjacently to the placing base and comprises a first opening portion opposed to the container which is placed on the placing base, and is configured to be communicated with an inner space of the container through an intermediation of the first opening;
    a first door which is capable of closing the first opening portion and retaining the lid of the container;
    a first inert-gas supply system which is capable of supplying an inert gas to an inside of the first chamber through a first control valve;
    a first discharge system which is capable of discharging gas existing in the inside of the first chamber through a second control valve;
    an oxygen level meter for measuring an amount of an oxide gas existing in the inside of the first chamber;
    a second chamber which is arranged adjacently to the first chamber, capable of being communicated with the first chamber through an intermediation of a second opening portion, and capable of being communicated with the processing chamber through an intermediation of a third opening portion;
    a second door which is capable of closing the second opening portion;
    a second inert-gas supply system which is capable of supplying the inert gas to an inside of the second chamber;
    a second discharge system which is capable of discharging gas existing in the inside of the second chamber;
    a transfer robot which is arranged in the inside of the second chamber, for transferring the object to be stored between the inside of the container and the processing chamber; and
    a control device for controlling an opening/closing operations of the first control valve and the second control valve, and an amount of the inert gas supplied by the first inert-gas supply system and an amount of the gas discharged by the first discharge system, in accordance with a process condition of the transfer system and a measurement result of the oxygen level meter for the first chamber,
    wherein the placing base is located outside the first chamber and is capable of generating a signal indicating that the container is placed on the placing base, and
    wherein the control device causes at least one of the first inert-gas supply system to stop the supplying of the inert gas and the first discharge system to stop the discharging of the gas when the oxygen level meter measures that the amount of an oxide gas present within the first chamber is equal to or lower than a predetermined value in a state where the container is not placed on the placing base, and causes the first inert-gas supply system to thereafter start supply of the inert gas and the first discharge system to start discharge of the gas when the control device receives the signal indicating that the container is placed on the placing base.

2. A transfer system according to claim 1, wherein the second chamber comprises a circulation system which is branched from the second discharge system and is connected with the second inert-gas supply system, for circulating the inert gas discharged from the inside of the second chamber so as to generate a downflow in the inside of the second chamber through an intermediation of the second inert-gas supply system, and
    the control device selectively executes the discharge of the inert gas by the second discharge system or the circulation of the inert gas by the circulation system.

3. A transfer system according to claim 1, wherein the first discharge system comprises a forcible discharge system which is capable of generating, in the inside of the first chamber, a negative pressure lower than an atmosphere pressure.

4. A transfer system according to claim 1, wherein, in a state in which the first door closes the first opening portion, when it is confirmed by the oxygen level meter that the amount of the oxide gas in the inside of the first chamber is equal to or lower than a predetermined value, the control device causes the first chamber to be a closed space by stopping at least one of the first inert-gas supply system and the first discharge system.

5. A transfer system according to claim 1, further comprising a plurality of the first chambers so as to execute transferring processes of the object to be stored in each of a plurality of corresponding containers, in parallel, wherein:

each of the first chambers has the first opening with the first door;

the second chamber comprises a plurality of the second opening portions and a plurality of the second doors correspondingly to the plurality of the first chambers and used for closing the second opening portions respectively, so as to communicate with the respective first chamber thorough the intermediation of the corresponding second opening;

the first inert-gas supply system is configured to supply the inert gas into each of the plurality of the first chambers through the corresponding first control valve;

the first discharge system is configured to discharge the gas existing in the inside of each of the plurality of the first chambers through the respective second control valve; and the oxygen level meter is configured within each of the plurality of the first chambers to measure the amount of the oxide gas existing in the inside of each of the plurality of the first chambers; and the control device independently controls opening/closing operations of the first control valve and the second control valve, and an amount of the inert gas supplied by the first inert-gas supply system and an amount of the gas discharged by the first discharge system, of the respective first chamber, on the basis of the process condition of the transfer system and the measurement result of the oxygen level meter for each of the plurality of the first chambers, so as to execute transferring processes of the object to be stored in the each of a plurality of the containers, in parallel.

6. A transfer system according to claim 1, wherein the first chamber further comprises a purge nozzle which is arranged around the first opening portion and capable of supplying, in a state in which the inside of the first chamber and the inside of the container are communicated with each other, an inert gas while having directivity toward the inside of the container.

* * * * *